United States Patent

Sirtori et al.

[11] Patent Number: 6,133,213
[45] Date of Patent: Oct. 17, 2000

[54] SOLUTION FOR REMOVING COPPER SALTS FROM A COPPER SURFACE COMPRISING AN ALCOHOL AND AN AMMONIUM SALT

[75] Inventors: Vittorio Sirtori, Milan; Giovanni Cattaneo, Lomagna; Fabio Mauri, Bernareggio, all of Italy

[73] Assignee: International Business Machines Corporation, Armonk, N.Y.

[21] Appl. No.: 09/357,588

[22] Filed: Jul. 20, 1999

[30] Foreign Application Priority Data

Mar. 4, 1999 [GB] United Kingdom ............... 9904871

[51] Int. Cl.⁷ .................................................. C11D 7/26
[52] U.S. Cl. ..................... 510/254; 510/175; 510/176; 510/255; 510/407; 510/432; 510/488; 510/505; 510/245; 134/2; 134/3; 134/26; 134/28; 134/29; 134/42
[58] Field of Search .................. 134/2, 3, 26, 28, 134/29, 42; 510/175, 176, 407, 432, 505, 245, 254, 255, 488

[56] References Cited

U.S. PATENT DOCUMENTS

| 4,085,208 | 4/1978 | Mallamo et al. ................... 424/180 |
|---|---|---|
| 4,276,186 | 6/1981 | Bakos et al. ...................... 252/158 |
| 4,619,741 | 10/1986 | Minten et al. ..................... 204/15 |
| 4,973,703 | 11/1990 | Imura et al. ...................... 548/342 |
| 5,106,537 | 4/1992 | Nelsen et al. ..................... 252/502 |
| 5,114,609 | 5/1992 | Buchwald et al. ................. 252/171 |
| 5,173,110 | 12/1992 | Stovicek ........................... 106/18.32 |
| 5,246,618 | 9/1993 | Buchwald et al. ................. 252/171 |
| 5,271,861 | 12/1993 | Buchwald et al. ................. 252/153 |
| 5,604,191 | 2/1997 | Unruh ............................... 215/14 |
| 5,628,833 | 5/1997 | McCormack et al. ............. 134/26 |
| 5,863,406 | 1/1999 | Mezzoni et al. .................. 205/126 |
| 6,008,353 | 12/1999 | Wu .................................... 546/13 |

FOREIGN PATENT DOCUMENTS 0 811 705   12/1997   European Pat. Off. .

*Primary Examiner*—Sharidan Carrillo
*Attorney, Agent, or Firm*—Pollock, Vande Sande & Amernick; Lawrence R. Fraley

[57] ABSTRACT

A water free solution for decontaminating copper surfaces (e.g. circuits of an electronic card) from copper salts which includes an alcohol and at least one neutral ammonium salt of an organic acid.

3 Claims, 1 Drawing Sheet

SOLUTION FOR REMOVING COPPER SALTS FROM A COPPER SURFACE COMPRISING AN ALCOHOL AND AN AMMONIUM SALT

FIELD OF THE INVENTION

The present invention relates to a method for decontaminating a copper surface from copper salts, particularly in the manufacturing of electronic cards.

BACKGROUND OF THE INVENTION

In the manufacturing of a microelectronic package (electronic cards), it is common practice to attach a component onto a printed circuit board or the like, for example by surface mounting utilizing a solder connection. For this purpose, the board features a circuit trace including a pad that constitutes a first surface for the connection; similarly, the component includes a second surface, for example a contact.

The interconnection method comprises the step of applying a solder alloy on the Cu substrate, typically onto the pad included in the printed circuit board.

The electronic components to be joined with the board are then brought into contact with the solder layer. The solder alloy is heated to cause the solder alloy to melt and reflow; heating may be by vapour phase reflow, infrared reflow, laser reflow, or the like. Upon cooling, the solder alloy resolidifies and bonds to the surfaces to complete the connection. The solder connection not only physically attaches the component to the board, but also electrically connects the trace on the board and the contact of the component to conduct electrical current to and from the component for processing. A flux is normally used to improve the solder alloy wettability with the pads of the board and the leads of the electronic components. The flux contains active chemicals, like organic acids and halide salts, that remove contaminants (e.g. copper oxyde, environmental and handling contaminants) from the pad and lead surfaces.

An inadequate cleaning of the electronic cards after soldering the components onto the substrate, can leave active flux residues, e.g. organic acids or inorganic halides on the copper circuits or connecting pads surface. These substances may be particularly harmful, because initially they are transparent and therefore not easily visible by the human eye. However, after several days of exposure to the atmosphere at room temperature and humidity, they can react with copper giving coloured carbonate, hydroxide, chloride or bromide salts, which are very difficult to remove. The presence of these copper salts on the circuits and the pads strongly affects the functionality of the electronic cards, because, when electric power is supplied, these salts can migrate and connect adjacent lines and pads creating short circuits. This effect is due to the salts being partially dissolved by water (which condenses from environmental humidity) and forming many electrolytic cells, whose electrodes are constituted by adjacent lines and pads; the electrolytic solutions is constituted by the ions of the salts solved in water. When electric power is supplied during the functioning of the card, an electrolysis process is induced inside every cell, with the movement of the positive (cations) and the negative (anions) ions of the salt toward respectively the cathode and the anode. A flow of electrons goes from the solution to the anode and, through the circuit, to the cathode causing the oxydation and the dissolution of the anode; at the same time on the cathode there is a deposition of metal, due to the release of electrons, coming from the anode, to the ions of the solution. This electrolysis process inside the cell causes an increase in the "size" of the cathode from the metal deposition, with a risk of line/pad bridging and a card failure due to short circuit.

The known techniques which use water based solution or organic solvents are not suitable for the removal of these contamination agent, because the copper salts are very slowly (and not always completely) soluble in water or in organic solvents.

On the other hand the use of stronger solvents such as ammonia or acid solutions would damage the materials of the boards and of the electronic components. Therefore these chemicals cannot be used for cleaning assembled electronic cards which always present corrodible materials e.g. copper, tin alloys, organic resins.

Furthermore ammonia and acid solvents in a water solution could not be used when two different materials having different electrochemical potentials are present on the electronic card. The reason is that this solution would induce plating phenomena on conductive surfaces, made of different material (e.g. copper and gold) having different electrochemical potentials (redox potential). When two metal surfaces having different redox potentials are connected with an electrolytic water solution (even without any electric power supply), a voltaic cell is formed with the production of an electromotive force which causes the dissolution of the metal with lower redox potential (e.g. copper) and its deposit on the metal surface with the higher redox potential (e.g. gold). These conditions may be found during the manufacturing of an electronic card, with a substrate having copper and gold surfaces, if the module was cleaned with a ionic water solution containing acid, ammonia and copper salts.

Therefore an improved treatment which removes the copper salts from the copper circuits and pads would be highly desirable.

It is an object of the present invention to provide a technique which alleviates the above drawbacks.

SUMMARY OF THE INVENTION

According to the present invention we provide a water free solution for removing copper salts from a copper surface comprising an alcohol and at least one compound selected from the family of neutral ammonium salts of organic acids.

Further, according to the present invention we provide a method for cleaning a copper surface comprising the step of immersing the copper surface in a water free solution comprising an alcohol and at least one compound selected from the family of neutral ammonium salts of organic acids.

DETAILED DESCRIPTION OF THE PREFERRED EMBODIMENT

Figure 1A:
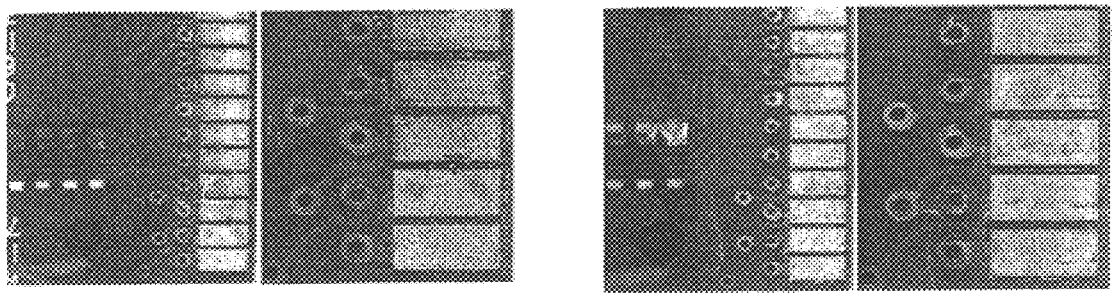
FIG. 1a shows a module after cleaning with water.

The solution and method according to the present invention use the principle of the formation of copper-ammonia complex for removing copper salts from the copper surfaces (circuits and pads) on the module substrate. The electronic card is cleaned with an alcoholic solution of a neutral ammonium salt of organic acid (e.g. ammonium acetate, ammonium propionate, ammonium lactate). The ammonium cations, complexing the copper, are able to solve the salts on the copper surface and to remove them from the board. The neutrality of the ammonium salt avoids the corrosion problems mentioned above.

The absence of water from the solution according to the present invention has two main advantages: to reduce the solution surface tension and to avoid the plating phenomena when two materials having different redox potentials (e.g. copper and gold) are both present on the card. The reduced surface tension of alcohol (about three times less than water) allows a better diffusion of the solution through very small holes. The above described plating phenomenon does not occur if an alcoholic cleaning solution according to the present invention is used, because the activity of ion copper in alcohol is very much lower than in water so that the transfer of copper ions from the solution to gold is almost impossible.

According to a preferred embodiment of the present invention, the electronic card to be cleaned is dipped in the neutral alcoholic solution of ammonium salts for about 4 minutes. The temperature of the solution should preferably be around 50 C. According to a preferred embodiment, during the immersion, the solution is constantly stirred, to maximise the diffusion and the cleaning action even through the smallest holes of the module substrate. After the immersion, the module is then rinsed (e.g. in ethanol) and dried with a warm air current.

According to a preferred embodiment of the present invention, the neutral ammonium salt (e.g. ammonium acetate, propionate, lactate) is added to the alcohol (e.g. ethanol). The concentration of the neutral ammonium salt is preferably between 4 g/l and the saturation concentration (e.g. for ammonium acetate in ethanol 150 g/1). According to a preferred embodiment of the present invention 38 g of ammonium acetate have been added to 1 liter of ethanol. Any other alcohol or alcoholic mixture able to dissolve ammonium salts, can be used instead of ethanol, e.g. methanol or isopropanol. The neutrality of the above described solution avoids the corrosion of the materials of the electronic card.

By immersing a copper surface (e.g. a Printed Circuit Board with copper circuits) in the above described solution, the copper salts present on the copper circuits are removed without damage to the other components on the module. Each copper ion is "surrounded" by several ammonium cations, creating ionic chemical bonds between copper and ammonium (complexing the copper) which causes the dissolution of the salts on the copper surface and the cleaning of the card.

Figure 1B:
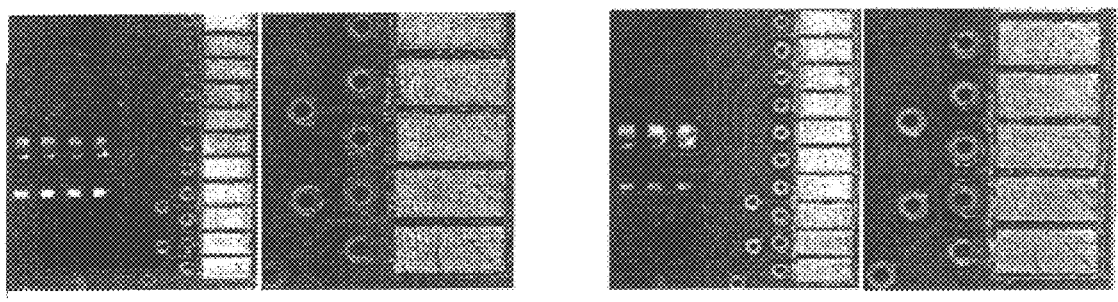
FIG. 1b shows a module after cleaning with ethanol.
Figure 1C:
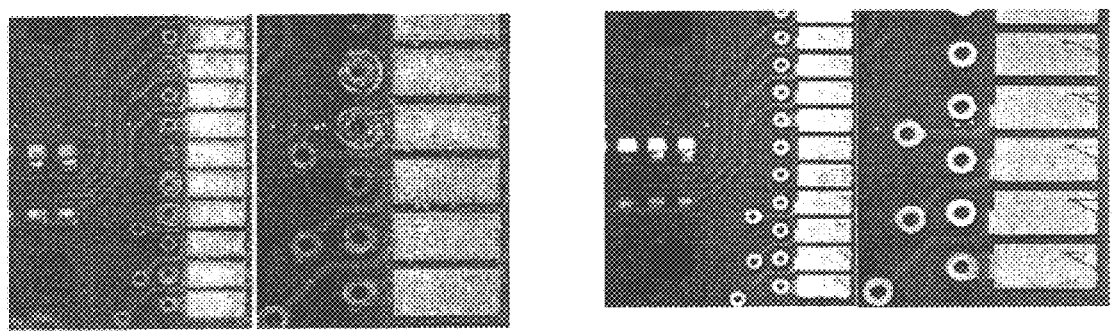
FIG. 1c shows a module after cleaning with a solution according to the present invention.

A copper surface treated with the cleaning solution according to a preferred embodiment of the present invention has been compared with surfaces treated with two of the mostly used prior art solvents: water and isopropanol. For this purpose, several electronic cards were contaminated with the same quantity of water soluble flux (Organoflux 3355/11), activated with chloride ions and placed in a climate chamber at 50 C. and 85% of relative humidity for 48 hours. This treatment was done to simulate the use of the package under severe environmental conditions. The modules were then immersed in the cleaning solutions for 4 minutes at 50 C. FIG. 1 shows the comparison of the modules after cleaning with water (FIG. 1a), ethanol (FIG. 1b) and the neutral alcoholic solution of ammonium salts according to a preferred embodiment of the present invention (FIG. 1c).

An ultraviolet spectroscopy of the copper dissolved in the solvent during the cleaning process has also been performed, for comparing the method according to a preferred embodiment of the present invention and the two prior art methods mentioned above. The analysis was performed with a UV Lamda 15 Perkin Elmer Spectrometer, reading the absorption of copper/ammonium complex at 612 nanometer. In table 1 below the analytical results are shown. It is clear that the solution according to a preferred embodiment of the present invention completely removes the copper salts from the card surface, while the amount of copper salts detected in the water and isopropanol solution is negligible. Note the theoretic value of copper is smaller than the experimental one, because it was considered only bivalent copper, while a small quantity of monovalent copper is also produced.

TABLE 1

| SOLVENT USED FOR CLEANING | THEORIC COPPER DUE TO CARD CORROSION ($\mu$g/sq.cm) | COPPER DETECTED IN CLEANING SOLVENT ($\mu$g/sq.cm) |
| --- | --- | --- |
| Alcoholic solution of ammonium acetate | 285 | 332 |
| Water | 285 | |
| Isopropanol | 285 | |

What is claimed is:

1. A water free solution for removing copper salts from a copper surface consisting essentially of an alcohol selected from the group consisting of methanol, ethanol, and isopropanol and at least one neutral ammonium salt of an organic acid selected from the group consisting of ammonium propionate and ammonium lactate.

2. The solution of claim 1 wherein the alcohol is ethanol.

3. The solution of claim 1 wherein the at least one neutral ammonium salt is present in a concentration of 4 g/l to 150 g/l.

* * * * *